US010824203B2

(12) United States Patent
Wong et al.

(10) Patent No.: US 10,824,203 B2
(45) Date of Patent: Nov. 3, 2020

(54) ROUTING OF FLEX CIRCUIT FOR TOUCH PANEL

(71) Applicant: Google LLC, Mountain View, CA (US)

(72) Inventors: Amy Lai Wong, Newark, CA (US);
Valentin de la Fuente, San Jose, CA (US); Paul Fordham, Wauconda, IL (US); Mark D. Jannick, Glen Ellyn, IL (US)

(73) Assignee: Google LLC, Mountain View, CA (US)

( * ) Notice: Subject to any disclaimer, the term of this patent is extended or adjusted under 35 U.S.C. 154(b) by 75 days.

(21) Appl. No.: 16/104,763

(22) Filed: Aug. 17, 2018

(65) Prior Publication Data
US 2020/0057473 A1 Feb. 20, 2020

(51) Int. Cl.
G09G 1/00 (2006.01)
G06F 1/16 (2006.01)
G06F 3/041 (2006.01)
H05K 1/02 (2006.01)
H05K 1/18 (2006.01)
H05K 5/00 (2006.01)

(52) U.S. Cl.
CPC .......... G06F 1/1658 (2013.01); G06F 1/1686 (2013.01); G06F 3/0416 (2013.01); H05K 1/028 (2013.01); H05K 1/189 (2013.01); H05K 5/0017 (2013.01); G06F 2203/04102 (2013.01); G06F 2203/04103 (2013.01); H05K 2201/056 (2013.01); H05K 2201/10151 (2013.01)

(58) Field of Classification Search
CPC .......... G01K 7/02; G01K 7/021; G01K 7/028; G06F 3/041; G06F 3/044; G06F 1/16; H05K 5/00; H05K 1/02
See application file for complete search history.

(56) References Cited

U.S. PATENT DOCUMENTS

| 7,891,988 B2 | 2/2011 | Dittmann et al. |
| 8,606,098 B1 | 12/2013 | Wang |
| 9,400,519 B2 | 7/2016 | Raff et al. |
| 9,503,554 B1* | 11/2016 | Kuo .................... H04M 1/0266 |
| 2014/0111953 A1 | 4/2014 | McClure et al. |
| 2015/0022741 A1 | 1/2015 | Nii et al. |
| 2017/0242457 A1* | 8/2017 | Lee ........................ G06F 1/1643 |
| 2018/0045580 A1* | 2/2018 | Merrikh ................. G01K 7/021 |
| 2018/0095570 A1* | 4/2018 | Hong .................... G06F 3/0412 |

FOREIGN PATENT DOCUMENTS

EP 3089021 A2 11/2016

OTHER PUBLICATIONS

International Search Report and Written Opinion for Application No. PCT/US2019/043235, dated Sep. 25, 2019, 14 pages.

* cited by examiner

Primary Examiner — Michael A Faragalla
(74) Attorney, Agent, or Firm — Brake Hughes Bellermann LLP

(57) ABSTRACT

A device includes: a sensor component; and a touch panel comprising: touch-registration circuitry; a mesh comprising conductors, wherein at least some of the conductors are routed to a junction; and a flex circuit coupled between the junction and the touch-registration circuitry, wherein the flex circuit is longer than a distance between the junction and the touch-registration circuitry to accommodate routing of the flex circuit past the sensor component.

23 Claims, 8 Drawing Sheets

ROUTING OF FLEX CIRCUIT FOR TOUCH PANEL

TECHNICAL FIELD

This document relates, generally, to routing of a flex circuit for a touch panel.

BACKGROUND

Many electronic devices nowadays rely on touch-sensing input devices. Tablets and smartphones are provided with touch panels that extend over the entire screen to allow users to interact with presented content, such as that provided by browsers or other applications.

SUMMARY

In a first aspect, a device includes: a sensor component; and a touch panel comprising: touch-registration circuitry; a mesh comprising conductors, wherein at least some of the conductors are routed to a junction; and a flex circuit coupled between the junction and the touch-registration circuitry, wherein the flex circuit is longer than a distance between the junction and the touch-registration circuitry to accommodate routing of the flex circuit past the sensor component.

Implementations can include any or all of the following features. The conductors comprise first conductors oriented in a first direction in the mesh, and second conductors oriented in a second direction in the mesh, the first conductors double-routed from the mesh to the junction. The device has at least first, second and third junctions and wherein the flex circuit comprises first and second flex members, wherein the first flex member is coupled between the first junction and the touch-registering circuitry and is longer than the distance between the junction and the touch-registration circuitry, wherein the first conductors are double-routed from the mesh to the first and second junctions, wherein the second flex member is coupled between the second junction and the touch-registration circuitry, and wherein the second conductors are routed from the mesh to the third junction. The second conductors form a stepwise width increase along an edge of the mesh in being routed from the mesh to the third junction, and wherein the first flex member bypasses the stepwise width increase. The device further comprises an aperture for the sensor component, the stepwise width increase located between the aperture and the edge of the mesh. The second flex member is also coupled between the third junction and the touch-registration circuitry. The device further comprises a bracket positioned along an edge of the mesh, the bracket configured for holding the sensor component. The device further comprises a cap that positions the sensor component against the bracket. The device further comprises a conductive surface on the bracket that provides ground for the touch-registration circuitry and for a display panel of the device. At least part of the flex circuit is wrapped against two opposite sides of the bracket. The flex circuit includes an alignment hole, and wherein the bracket includes a pin corresponding to the alignment hole. The device further comprises an alignment rail on the bracket, the alignment rail aligning the flex circuit against the bracket. The device further comprises adhesive coupling at least a first portion of the flex circuit to the bracket, the coupling causing a second portion of the flex circuit to conform to the sensor component. The flex circuit comprises first and second flex members, wherein at least part of each of the first and second flex members is wrapped against the two opposite sides of the bracket.

In a second aspect, a tablet includes: a coverglass; a sensor component positioned against the coverglass; a display panel configured to be viewed through the coverglass; and a touch panel comprising: touch-registration circuitry; a mesh positioned between the coverglass and the display panel, the mesh comprising conductors, wherein at least some of the conductors are routed to a junction; and a flex circuit coupled between the junction and the touch-registration circuitry, wherein the flex circuit is longer than a distance between the junction and the touch-registration circuitry to accommodate routing of the flex circuit past the sensor component.

Implementations can include any or all of the following features. The conductors comprise first conductors oriented in a first direction in the mesh, and second conductors oriented in a second direction in the mesh, the first conductors double-routed from the mesh to the junction, and wherein the first direction corresponds to a horizontal direction in a landscape orientation of the device, and wherein the second direction corresponds to a vertical direction in the landscape orientation of the device. The routing of the flex circuit is symmetrical about the sensor component.

In a third aspect, a device includes: a sensor component; a bracket configured to hold the sensor component; and a touch panel, wherein the bracket is mounted to the touch panel, the touch panel comprising: touch-registration circuitry; a mesh comprising conductors, wherein at least some of the conductors are routed to a junction; and a flex circuit coupled between the junction and the touch-registration circuitry, wherein at least part of the flex circuit is wrapped against two opposite sides of the bracket.

Implementations can include any or all of the following features. The device further comprises a coverglass and a display panel configured to be viewed through the coverglass, wherein the mesh is positioned between the coverglass and the display panel. The flex circuit accommodates placement of the sensor component against an inside surface of the coverglass. The touch-registration circuitry is mounted to the bracket and wherein the bracket positions the touch-registration circuitry so that the touch-registration circuitry partially overlaps the display panel. The flex circuit comprises first and second main portions extending in a first direction, and wherein: a first portion of the flex circuit extends from the first main portion in a second direction diverging from the first direction, a second portion of the flex circuit extends from the first portion past the sensor component in the first direction, and a third portion of the flex circuit extends from the second portion in a third direction toward the second main portion. The sensor component comprises a camera.

BRIEF DESCRIPTION OF DRAWINGS

Like reference symbols in the various drawings indicate like elements.

DETAILED DESCRIPTION

This document describes examples of devices and approaches for routing one or more flex circuits that facilitate registration of touch inputs. Such flex circuits can serve as transmission lines for a circuit board that performs touch registration. In some implementations, the flex circuit can be part of a camera assembly for a tablet or other device, and can be coupled to a printed circuit board (PCB) for a touch panel. For example, at least some of the flex circuit can be made longer than it would otherwise need to be given the distance to the PCB, and the additional length can facilitate routing the flex circuit (e.g., part thereof) about a camera in the assembly. For example, such approaches can allow the camera assembly to be mounted directly against a coverglass of the device. For example, such approaches can allow the camera assembly to be placed closer to a display panel of the device. A camera assembly can include a bracket that positions the camera in relation to the coverglass. A device can include a bracket that controls the positioning and/or bending of the flex circuit.

In some implementations, a metal mesh film is placed between a coverglass and a display panel of the device. Electrical conductors, such as traces, for touch registration can be routed to an edge of the display panel (e.g., the "top" edge with reference to a landscape orientation of the device). The routing of traces can lead to growth of the borders of the display panel if many or all traces are routed through the same area. In some implementations, transmission lines can be double routed, and the available thickness in the product can be used to fit a flex under the display panel to pull the double-routed transmission lines together. In some implementations, at least part of a flex circuit has a longer length than would otherwise be necessary to facilitate avoidance of border growth due to stacking of transmission lines. In some implementations, a flex circuit can be routed about (e.g., around) a sensor component (e.g., a camera). In some implementations, a three-dimensional element (e.g., a bracket) is used to facilitate placement of flex circuitry for a touch panel.

Figure 1:
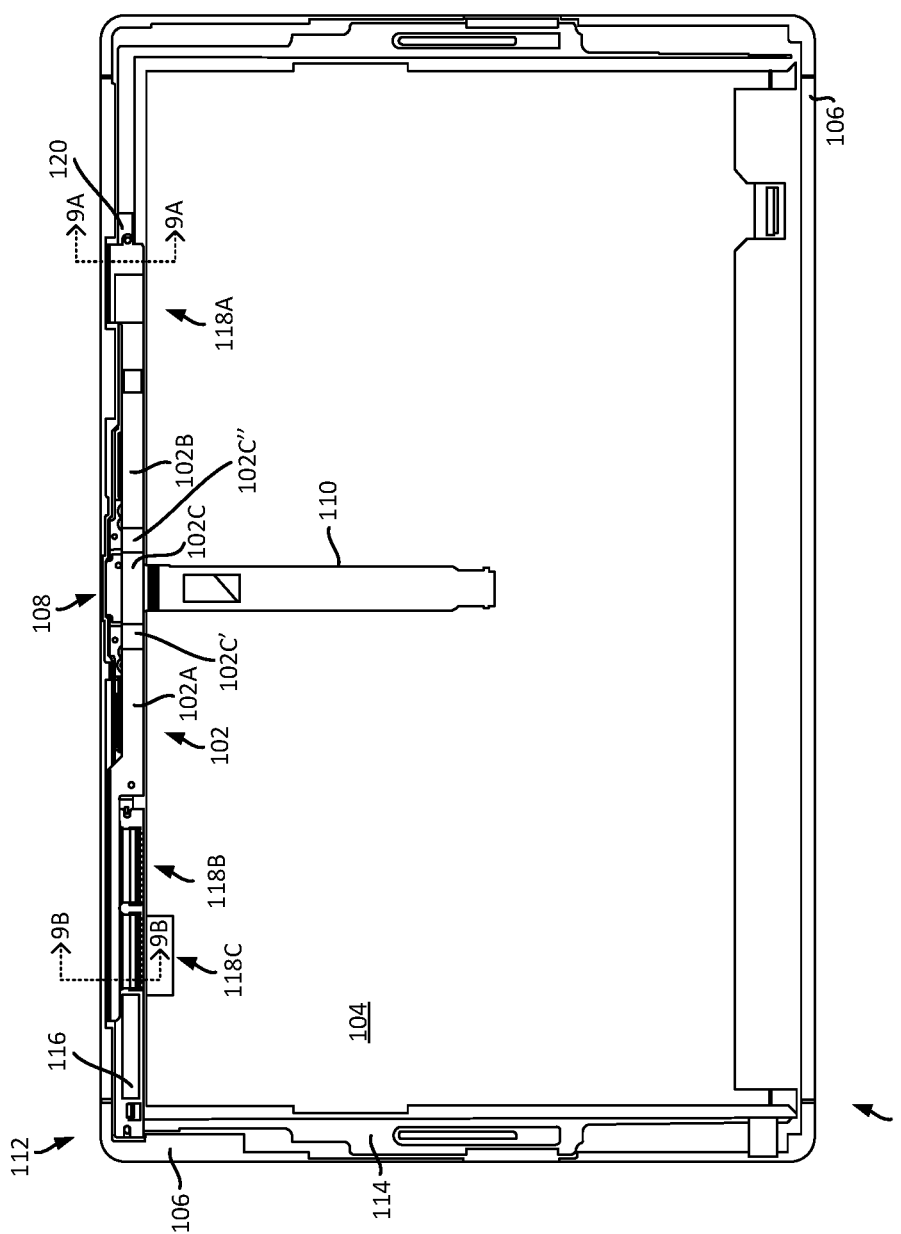
FIG. 1 shows a rear view of an example of a device having a flex circuit.

FIG. 1 shows a rear view of an example of a device 100 having a flex circuit 102. The device 100 and/or the flex circuit 102 can be used with one or more other examples described herein. In some implementations, the device 100 can serve as a tablet, a smartphone and/or another electronic device, including, but not limited to, a laptop computer, a wearable device or a television. The device 100 is here shown with some components omitted for clarity of illustration. Other components may be obscured due to the orientation of the device 100. For example, the device 100 can here be considered as shown from the rear with the absence of some components (e.g., a rear housing) allowing views of the interior of the device 100. As such, a front (not visible) of the device 100 can contain a coverglass through which a user can observe presented content and interact with the device 100.

The device includes a display panel 104. The display panel 104 can provide presentation of information in form of an array of individually addressable pixels. The display panel 104 can have any shape, including, but not limited to, a square or otherwise rectangular shape. Any suitable display technology can be used for the display panel 104. For example, the display panel 104 can be a liquid-crystal display (LCD) or an light-emitting diode (LED) display.

As mentioned, the device 100 can be intended for assembly into one or more forms of housing which are not shown for clarity. Here, an outer edge 106 that surrounds the device 100 can be an adhesive (e.g., a pressure sensitive adhesive (PSA)) intended for adhesion of a coverglass (not shown) to such a housing in order to implement the device 100 in a durable packaging.

The device 100 can be intended for use in one or more orientations. In some implementations, the device 100 is implemented in a portable electronic device (e.g., a tablet or smartphone). A user can then observe the display panel 104 with the device 100 in a landscape orientation (as shown, with longer edges extending in a left-right direction) or in a portrait orientation (with shorter edges extending in a left-right direction). In some implementations, the device may be implemented for more permanent installation in either a landscape or portrait orientation (such as by mounting on a wall or other support structure). As such, what is the "top" of the device 100 can vary. In the present description, the side of the device 100 that is closest to the flex circuit 102 is sometimes referred to as the top edge for purposes of explanation only.

The device 100 includes a cap 108 that is here partially obscured by the flex circuit 102. The cap 108 can hold one or more components of the device 100. In some implementations, the cap 108 can hold a sensor component, including, but not limited to, a camera. For example, the camera can be oriented in a direction away from the observer in the present illustration. The camera or other sensor component can have one or more connections to other circuitry in the device 100. Here, a flex circuit 110 for the sensor component is shown.

The device 100 provides one or more touch-sensitive devices for user input. In some implementations, a touch panel 112 allows the device 100 to register user input performed with a fingertip, a hand or another part of the body, and/or a stylus. For example, the touch panel 112 can include a mesh 114 (here partially obscured by the display panel 104) and a touch-registration circuitry (TRC) 116. The TRC 116 can include one or more processors or other circuits that allow the touch panel to probe the mesh 114 for input signals and to interpret the input signals to differentiate various types of possible input. The TRC 116 can provide one or more outputs to another processing component of the device 100 (not shown). For example, such processing component can provide an operating system for the device 100 and thereby manage the functions of the display panel 104, other input or output devices, and/or handle communication to or from other devices (e.g., by wireless signal). The mesh 114 and the TRC 116 can be coupled to each other by the flex circuit 102, for example as described below.

The mesh 114 can include electrodes or other electrically conductive elements that transmit electric signals for receipt by the TRC 116. Such electrodes/elements can be grouped in one or more ways. The groupings can terminate at one or more points or areas on the device 100 where the signals in respective traces or other conductors can continue to be transmitted through another component. Such points/areas are here referred to as junctions for simplicity which can indicate that the signals in the traces/conductors there can continue and be transmitted into another component while maintaining the respective signals distinguishable from each other. Here, junctions 118A-C are indicated. The flex circuit 102 can be coupled to the mesh 114 at some or all of the junctions 118A-C. This can allow a part of the flex circuit 102 to be routed past the sensor component of the cap 108, for example as will be described below. The routing can require the (part of) the flex circuit 102 to be longer than it otherwise would have been. For example, the part of the flex circuit 102 can be longer than the distance between the junction 118A and the TRC 116. The device 100 can include a bracket 120 that can extend along some or all of an edge of the mesh 114. Here, the bracket 120 extends over most of the width along the top edge of the device 100.

The device 100 is an example of a device that includes a sensor component (e.g., carried by the cap 108) and touch panel (e.g., the touch panel 112). The touch panel can include touch-registration circuitry (e.g., the TRC 116) and a mesh comprising conductors (e.g., the mesh 114. At least some of the conductors are routed to first and second junctions (e.g., the junctions 118A and 118C). The touch panel can include a flex circuit (e.g., the flex circuit 102). The flex circuit can include a first flex member and a second flex member. The first flex member can be longer than a distance between the first junction and the touch-registration circuitry to accommodate routing of the first flex member past the sensor component. The bracket 120 can be configured for holding one or more components. For example, the sensor component can be mounted to the bracket 120. The cap 108 can facilitate mounting of the (sensor) component to the bracket 120.

The following example illustrates routing of the first flex member past the sensor component. The flex circuit 102 can include at least portions 102A-C. Here, the portion 102A is positioned between the junction 118B and the cap 108 for the sensor component. The portion 102B, moreover, is positioned between the cap 108 and the junction 118A. The portions 102A and 102B can be positioned in a common plane. For example, the common plane can be a surface that extends along the length of the bracket 120. The cap 108, on the other hand, may in the present illustration extend closer to the viewer than does the common plane of the portions 102A and 102B. That is, the cap 108 can prevent the flex circuit 102 from continuously extending along the common plane of the portions 102A and 102B between the junctions 118B and 118A. The portion 102C can be positioned in a plane other than the common plane of the portions 102A and 102B. For example, in the present illustration the plane of the portion 102C can be closer to the viewer than is the common plane of the portions 102A and 102B. The position of the portion 102C can be facilitated by portion 102C' and portion 102C" of the flex circuit 102. The portion 102C' is here diverging from the common plane of the portions 102A and 102B, at the portion 102A, to the plane of the portion 102C, at the portion 102C. The portion 102C" is here diverging from the plane of the portion 102C, at the portion 102C, to the common plane of the portions 102A and 102B, at the portion 102B. This example shows routing of the flex circuit 102 past the sensor component that can be held by the cap 108 in that the cap 108 here interrupts the common plane of the portions 102A and 102B. The portions 102C' and 102C" can accommodate such a routing past the sensor component by allowing at least the portion 102C to be positioned in the plane other than the common plane of the portions 102A and 102B. For example, the portions 708-712 (FIG. 7) can be sized so that some or all of the portions 708-712 (e.g., at least the portion 710) is in contact with the cap at the position where the camera 702 is positioned. For example, the portions 708-712 can be sized so that less than all, or none, of the portions 708-712 is in contact with the cap at the position where the camera 702 is positioned.

Figure 2:
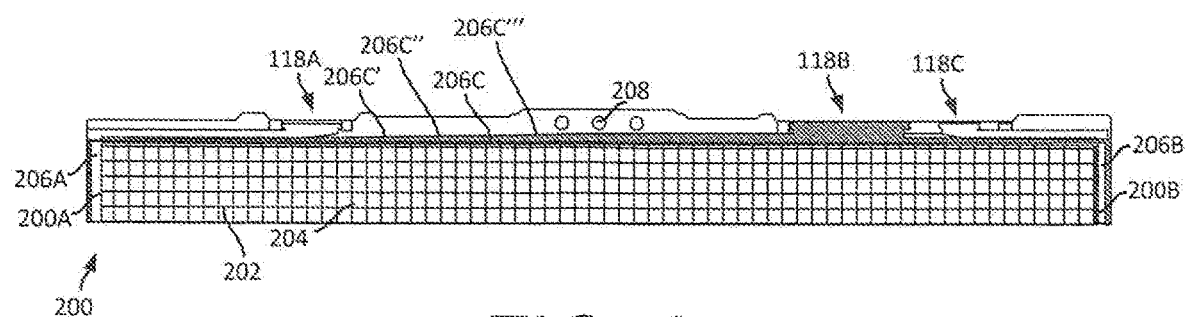
FIG. 2 shows an example of a mesh.

FIG. 2 shows an example of a mesh 200. The mesh 200 can be used with one or more other examples described herein. The mesh 200 is here only shown in part for simplicity and can be implemented in combination with TRC, as part of a touch-panel solution, in one or more types of device (e.g., a tablet or smartphone). The mesh 200 includes conductors 202 that are oriented in one direction, and conductors 204 that are oriented in another direction. The conductors 202 and 204 are here essentially perpendicular to each other and form a regular grid or array over the mesh 200. The mesh 200 is here positioned in a landscape orientation where its horizontal length is greater than its vertical length. In the landscape orientation, the conductors 202 can be considered to be horizontally oriented and the conductors 204 can be considered to be vertically oriented.

Touch panels can be implemented to recognize user input in one or more ways. For example, a user can employ a fingertip or other body part to make an input that is recognized to trigger one or more operations or functions in the device. Also, or alternatively, a user can employ a stylus to make a recognized input. The technical requirements for a stylus-enabled solution can be more strict or demanding than with a finger-operated touch screen. For example, the TRC may need to operate at a higher frequency to recognize a stylus than a fingertip. The higher frequency may be needed in order to provide a faster ramp time between pulses of the TRC because stylus-enabled solutions may operate at a relatively shorter RC (resistance/capacitance) time constant. In order to reduce the resistance across lines of the mesh 200, at least some of the conductors 202 and 204 can be double routed.

Here, the conductors 202 are longer than the conductors 204 and the conductors 202 are double routed. The part of the conductors 202 that exit at a side 200A of the mesh 200 can be considered left-side horizontal traces 206A and the part of the conductors 202 that exit at a side 200B of the mesh 200 can be considered right-side horizontal traces 206B. Here, the terms "left" and "right" are used only for clarity with respect to the present illustration. The view of the mesh 200 can be considered to be from the opposite direction compared to the device 100 in FIG. 1. The conductors 204, moreover, can have vertical traces 206C. The respective traces 206A-C can converge at one or more specific points or areas relative to the mesh 200. Here, the left-side horizontal traces 206A are gathered at the junction 118A, the right-side horizontal traces 206B are gathered at the junction 118C, and the vertical traces 206C are gathered at the junction 118B. Accordingly, the traces 206A-B of the conductors 202 are double routed to the respective junctions 118A and 118C.

The mesh 200 includes a sufficient number of the conductors 202 and 204 to provide the sensitivity needed for an intended implementation. As such, significant numbers of the traces 206A-C may be present adjacent the mesh 200. As more and more traces are gathered, their cumulative width or size increases. Here, for examples, the vertical traces 206C have a relatively smaller width toward the junction 118A and a relatively greater width toward the junction 118C. Over the length of the vertical traces 206C, the width progressively increases as traces for more of the conductors 204 are added to the vertical traces 206C. That is, a new trace that is added to the traces 206C adds a quantum of width to the vertical traces 206C at a portion 206C', a new trace adds another quantum at a portion 206C" such that the portion 206C" is wider than the portion 206C', a new trace adds another quantum at a portion 206C'" such that the portion 206C'" is wider than the portion 206C", and so on. As such, the vertical traces 206C can be said to exhibit a stepwise width increase along (in this example) the top edge of the mesh 200. For example, the portion 206C'" is wider than the portion 206C", which is wider than the portion 206C'.

Many manufacturers of touch-panel devices seek to avoid having wide borders surround the viewable area of the device's display, because the borders can be considered aesthetically unfavorable and/or because the manufacturer would rather make the viewable screen as large as possible given the overall size of the device. It can therefore be advantageous to minimize the width of the borders around the display. Here, for example, if the left-side horizontal traces 206A had instead been routed to the junction 118C to there be united with the right-side horizontal traces 206B, this would likely have added border width in the area where the vertical traces 206C are located. Thus, such an approach could have increased the severity of the stepwise width increase in that area. For example, an aperture 208 for a sensor component (e.g., a camera) is here positioned on the other side of the stepwise width increase from the top edge of the mesh 200. If the stepwise width increase has been greater in that area due to the presence also of the traces 206A and/or 206B, the aperture 208 may have been placed further from the mesh 200, leading to a potentially undesirable increase in border width. Instead, the traces 206A-B are here double routed to at least in part bypass the stepwise width increase of the vertical traces 206C. At the junction 118A, the left-side horizontal traces 206A can be coupled to at least part of the flex circuit 102 (FIG. 1), for example as will be described below.

Figure 3:
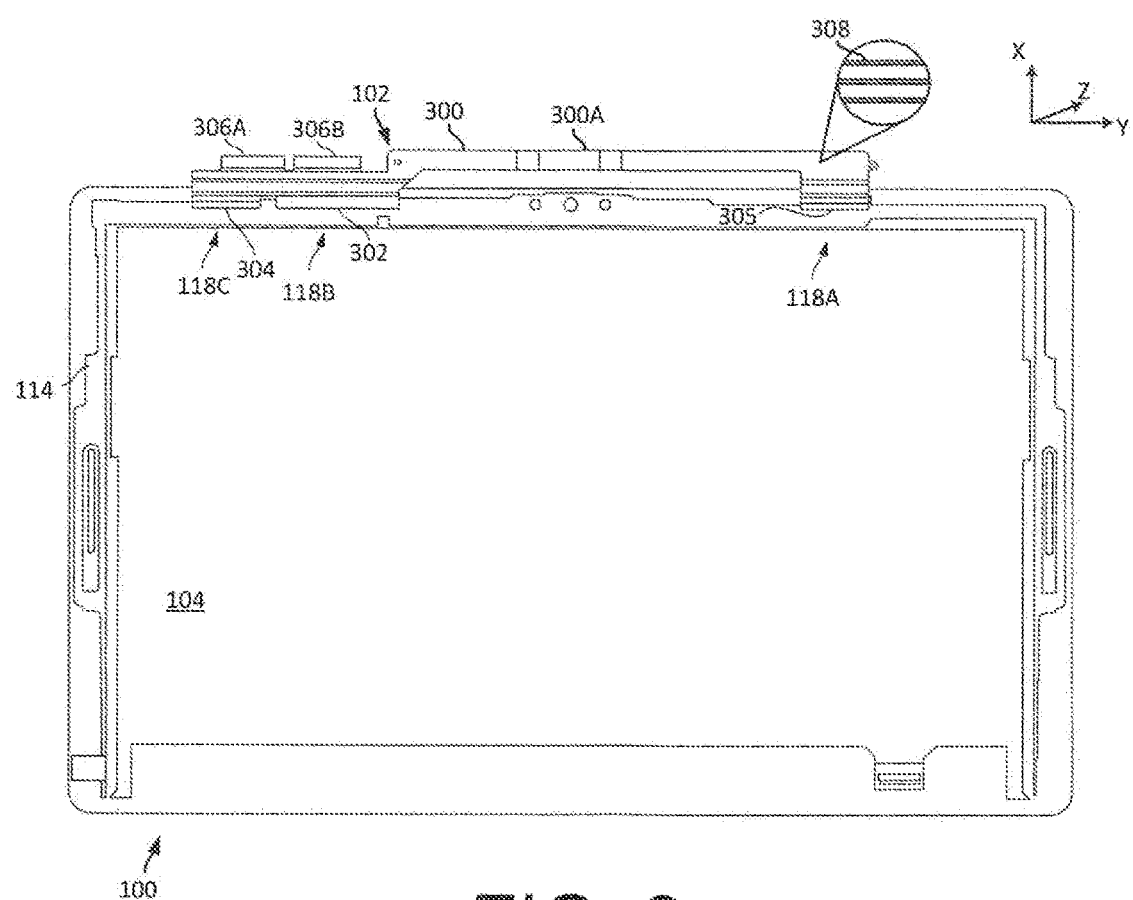
FIG. 3 shows an example of the device in FIG. 1 prior to some assembly.

FIG. 3 shows an example of the device 100 in FIG. 1 prior to some assembly. The device 100 as exemplified here can be used with one or more other examples described herein. In some implementations, the device 100 as shown here can represent the state of assembly after display lamination has been performed (e.g., by a separate vendor) and before assembly of a camera bracket (e.g., the bracket 120 in FIG. 1 with the sensor component of the cap 108). The device 100 can here be considered as viewed from the back and some components that may be present (e.g., a coverglass) are therefore not visible.

The flex circuit 102 here includes respective flex members 300, 302 and 304. An end 305 of the flex member 300 is coupled to traces at the junction 118A; one end of the flex member 302 is coupled to traces at the junction 118B; and one end of the flex member 304 is coupled to traces at the junction 118C. Such and other configurations can allow the flex member 300 to bridge over at least part of an area occupied by one or more other categories of traces for the mesh 114 such that border extension is avoided or minimized. The flex circuit 102 also has terminals 306A-B which may be intended to be coupled to TRC at a later stage of assembly. In some implementations, the flex members 300 and 304 (e.g., corresponding to horizontal lines in the mesh 114) can be coupled to one of the terminals 306A-B, and the flex member 302 (e.g., corresponding to vertical lines in the mesh 114) can be coupled to the other of the terminals 306A-B. Traces 308 of the flex member 300 are shown as an example. Two or more of the flex members 300, 302 or 304 can be considered a single flex member in some implementations. For example, the flex members 302 and 304 can be considered a single flex member that is coupled between, on the one hand, the junctions 118B-C and, on the other hand, the TRC (e.g., the TRC 116 in FIG. 1). The flex members 300, 302 and 304 can be coupled to traces of the mesh 114 (e.g., at the respective junctions 118A-C) using any suitable technique. For example, bonding using an anisotropic conductive film (ACF) can be used.

In the illustrated example, the junctions 118B and 118C are located next to each other. In other implementations, the junctions 118B and 118C can be spaced further apart from each other. In some implementations, the junction 118A can be positioned between the junctions 118B and 118C.

As mentioned, the device 100 in this example is illustrated before certain assembly is performed. In some implementations, the flex circuit 102 in subsequent assembly can at least partially be bent, folded or otherwise reshaped compared to the configuration shown here so that one or more portions of the flex circuit 102 are brought closer to the mesh 114. For example, the flex member 300 can be folded toward the nearest edge of the mesh 114. For example, the terminal 306A can be folded toward the junction 118C, and the terminal 306B can be folded toward the junction 118B. The flex circuit 102 can be configured so that the traces of the flex member 300 (which can pertain to right-side horizontal lines of the mesh 114 from the present perspective) and the traces of the flex member 304 (which can pertain to left-side horizontal lines of the mesh 114 from the present perspective) are joined into a common bundle or grouping of traces before reaching the TRC (e.g., the TRC 116 in FIG. 1). For example, the TRC can use one pin per electrode (i.e., per trace).

At least one portion of the flex circuit 102 can have a greater length than some predefined distance. In some implementations, the flex member 300 can be longer than the shortest length spanning the distance between the junction 118A and the TRC 116 (FIG. 1). Here, an extra length 300A is schematically shown along the extent of the flex member 300. How to determine a predefined length and how much extra length is required can depend on the particular implementation. A three-dimensional Cartesian coordinate system having x-, y- and z-axes is shown for illustration. The x-axis lies in the plane of the drawing and extends in a vertical direction. The y-axis also lies in the plane of the drawing and extends in a horizontal direction. The z-axis is perpendicular to the x- and y-axes and extends into the drawing. The distance can be measured according to one or more of the corresponding spatial dimensions. For example, if the predefined distance between the junction 118A and the TRC 116 (FIG. 1) is $D_y$ measured only as their separation with regard to the y-axis, then the length of the flex member 300 can be expressed as $D_y+d_1$, where $d_1$ indicates the extra length 300A. For example, the predefined distance between the junction 118A and the TRC 116 (FIG. 1) can be $D_y+D_x$ measured only as their separation with regard to the y-axis and the relevant offset in the x-direction (e.g., vertically from the TRC 116, then horizontally, then finally vertically to the junction 118A). The length of the flex member 300 can then be expressed as $D_y+D_x+d_2$, where $d_2$ indicates the extra length 300A. For example, the predefined distance between the junction 118A and the TRC 116 (FIG. 1) can be $D_y+D_x+D_z$ measured as their separation with regard to the y-axis and the relevant offsets in the x- and z-directions (e.g., vertically from the TRC 116, then horizontally including one or more offsets in the z-direction, then finally vertically to the junction 118A). The length of the flex member 300 can then be expressed as $D_y+D_x+D_z+d_3$, where $d_3$ indicates the extra length 300A. The extra length 300A can be used in one or more ways to facilitate a more efficient use of space in the device 100, for example by routing the flex member 300 past one or more components as will be described below.

Figure 4:
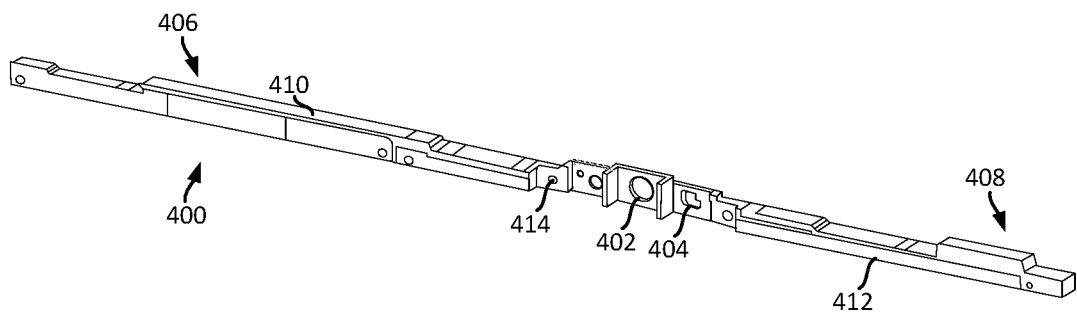
FIG. 4 shows an example of a bracket.

FIG. 4 shows an example of a bracket 400. The bracket 400 can be used with one or more other examples described herein. For example, the bracket 400 can serve essentially the function of the bracket 120 (FIG. 1). The bracket 400 can be configured for holding one or more components for a device. In some implementations, an aperture 402 in the bracket 400 can facilitate mounting of a sensor component (e.g., a camera) on the bracket 400. For example, this can facilitate use of the bracket 400 in positioning the sensor component relative to one or more other aspects of the device (e.g., against a coverglass). In some implementations, an aperture 404 can facilitate mounting of one or more other components. For example, the aperture 404 can accommodate an LED and/or an ambient light sensor (ALS). A diffusion film can be applied to the LED to diffuse the light thereof (e.g., for cosmetic reasons). For example, the diffusion film can be covered by a liner before assembly.

One or more portions of the bracket 400 can be configured for a flex member. In some implementations, the bracket 400 can have portions 406 and 408. The portion 406 and/or 408 can have a cross section that is essentially polygonal (e.g., square or otherwise rectangular) and can be provided with one or more features that facilitate assembly of the flex member(s). In some implementations, adhesives 410 and/or 412 can be applied. For example, the adhesives 410 and/or 412 can be a pressure-sensitive adhesive (PSA). The adhesives 410 and/or 412 can be placed on one or more sides of the bracket 400, including, but not limited to, on adjacent sides or on opposite sides thereof. PSA can also or instead be applied to secure one or more components to the bracket 400 (e.g., at the aperture 402), and/or to secure the bracket 400 against some aspect of the device.

A sensor component such as a camera can be secured using adhesive, including, but not limited to, PSA. In some implementations, the camera can be affixed at the aperture 402 using PSA, and also affixed relative to a cap (e.g., the cap 108 in FIG. 1) using PSA. The camera can be aligned concentrically with the aperture 402 using some equipment, including, but not limited to, a charge-coupled device (CCD). The CCD can ensure concentricity by detecting the camera barrel relative to the aperture 402, and the camera placement can be adjusted accordingly. For example, during use of the device the camera can be subjected to shear forces perpendicular to the direction of the camera. It may therefore be advantageous to select the PSA or other adhesive so as to reduce or minimize shifting or creeping.

The bracket 400 can be made of any suitable material considering its intended use (e.g., to hold a sensor component and act as a guide for a flex member). In some implementations, the bracket 400 includes a polymer material, such as a molded plastic or other synthetic material. In some implementations, the bracket 400 can be machined from material stock. The bracket 400 can include one or more threaded inserts 414. For example, the insert(s) 414 can be intermolded in the manufacturing of the bracket 400.

Figure 5:
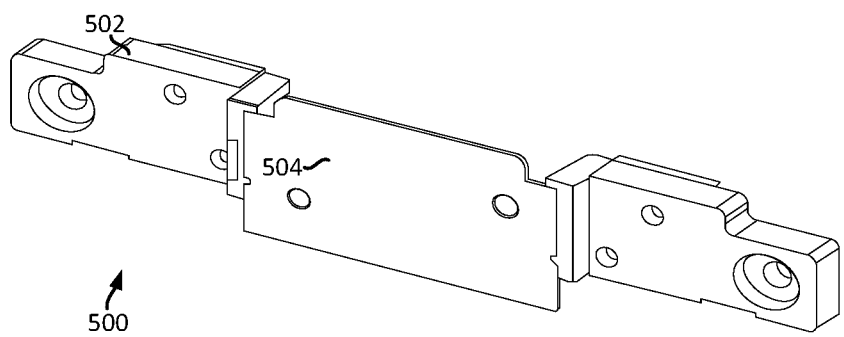
FIG. 5 shows an example of a cap for a sensor component.

FIG. 5 shows an example of a cap 500 for a sensor component (not shown). The cap 500 can be used with one or more other examples described herein. For example, the cap 500 can serve as the cap 108 (FIG. 1) and/or can hold one or more components with regard to the bracket 400 (FIG. 4). The cap 500 can include a body 502 of a suitable material, including, but not limited to, a molded polymer. The cap 500 can include a plate 504 configured to abut against the sensor component (e.g., against a back of the camera or a housing holding the camera). In some implementations, a material can be placed between the camera and the plate 504 to bridge for tolerances. For example, a compressible material, including, but not limited to, foam, can be used. The plate 504 can be made of any suitable material, including, but not limited to, sheet metal. The cap 500 can also or instead hold one or more other components. In some implementations, the cap 500 can hold an LED and/or an ALS.

Figure 6:
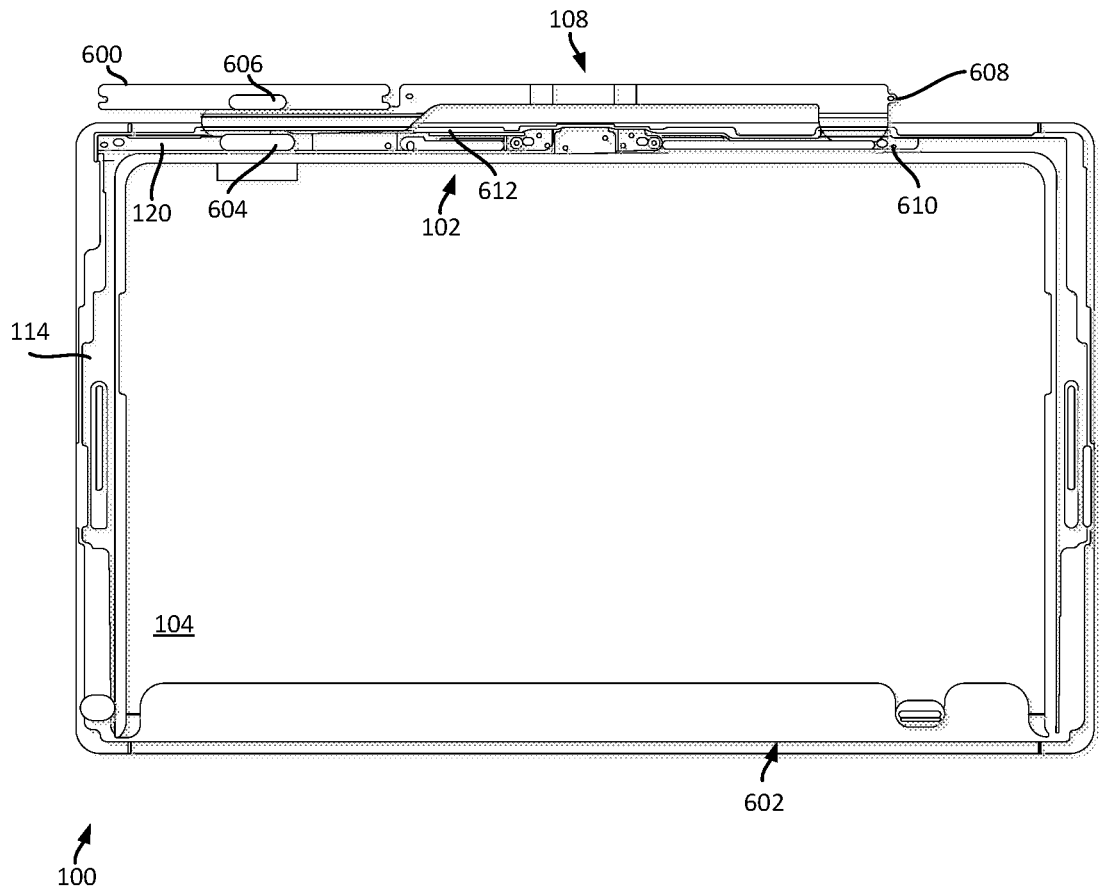
FIG. 6 shows an example of the device in FIG. 1 prior to some assembly.

FIG. 6 shows an example of the device 100 in FIG. 1 prior to some assembly. The device 100 as exemplified here can be used with one or more other examples described herein. The device includes a circuit board 600 (e.g., a PCB) that has arranged thereon at least part of a TRC (e.g., the TRC 116 in FIG. 1) for the device 100. For example, the circuit board 600 can be attached by way of connection of such a TRC to the terminals 306A-B (FIG. 3). The illustration of the device 100 in the present example can represent a state of a subassembly before the flex circuit 102 is folded down over a sensor component (e.g., toward the cap 108) where it can be attached (e.g., using PSA). The circuit board 600, similarly, can be attached to the bracket 120 (e.g., using a fastener).

This illustration also exemplifies another circumstance that can motive providing extra length in the flex circuit 102. A "bottom" edge 602 (the opposite of the "top" edge where the flex circuit 102 is positioned) can for certain reasons be wider than the other edges that define the visibility of the display panel 104. For example, the bottom edge 602 can be wider because the corresponding bottom edge of the display is wider. In the past, it has sometimes been decided to route conductors (e.g., the conductors 202 and 204) along such a (wider) edge, because the additional space required by traces can be accommodated within the already existing greater width. However, unwanted interference between such touch-panel conductors and the display panel can arise as a result. By contrast, the routing of the flex circuit 102 may not give rise to similar interference problems. That is, approaches that involve certain ways of routing a flex circuit (e.g., the flex circuit 102) can serve to realize the advantage of avoiding greater borders around a touch-panel display.

Brackets in accordance with examples described herein (e.g., the bracket 120 and/or 400) can provide one or more advantages. In some implementations, the bracket can control the type and/or amount of bending to which a flex circuit is subjected. For example, the bracket 120 and/or 400 can protect the flex circuit 102 against unwanted bending relative to the mesh 114. This can decrease unexpected strains on the attachment of the flex circuit to the mesh (e.g., at one or more of the junctions 118A-C).

In some implementations, the bracket can align and control a relatively long flex circuit. For example, the flex member 300 (FIG. 3) can be prevented from unexpectedly interfering with other components of the device 100.

In some implementations, the bracket can align and hold a sensor component with regard to at least one other aspect of the device. For example, a camera can be held concentrically positioned with regard to an aperture in a black mask that is applied to a coverglass of the device.

In some implementations, the bracket can hold a circuit board. For example, the bracket can hold the circuit board 600 in a position to facilitate reliable coupling of the flex members 300-304 (FIG. 3) to the TRC 116 (FIG. 1).

In some implementations, the bracket can hold one or more components in addition to, or instead of, a sensor component. For example, the bracket 120 and/or 400 can hold an LED and/or an ALS. This can involve a cap (e.g., the cap 108 in FIG. 1 and/or the cap 500 in FIG. 5).

The bracket 120 can have one or more conductive surfaces. Here, a conductive surface 604 on the bracket 120 is shown. For example, the conductive surface 604 can be formed using a conductive adhesive. The conductive surface 604 can be electrically connected to (e.g., touch) the display panel 104 and a conductive surface 606 on the circuit board 600. For example, the conductive surface 604 can provide a common ground for these and/or other components.

The bracket 120 can have one or more alignment features for the flex circuit 102. In some implementations, the flex circuit 102 can have an alignment hole 608 that corresponds to a pin 610 on the bracket 120. This can provide proper positioning of the flex circuit 102 in the device 100. In some implementations, the flex circuit 102 can have an alignment rail 612. This can provide proper positioning of the flex circuit 102 against the bracket 120 in the device 100.

Figure 7:
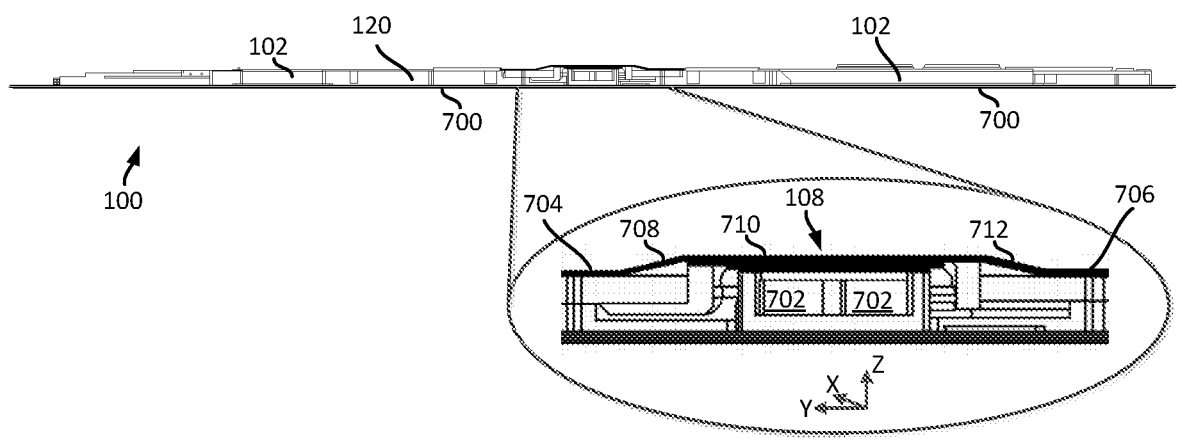
FIG. 7 shows a side view of an example of the device in FIG. 1.

FIG. 7 shows a side view of an example of the device 100 in FIG. 1. The device 100 as exemplified here can be used with one or more other examples described herein. Here, the flex circuit 102 has been partially wrapped about the bracket 120 and is only partially visible. A coverglass 700 is mounted on the device 100. The coverglass 700 can be made of a transparent material (e.g., alkali-aluminosilicate glass). In some implementations, the mesh 114 (FIG. 1) can be positioned between the coverglass 700 and the display panel 104 (FIG. 1). For example, the display panel 104 (FIG. 1) can be viewed, and the mesh 114 can sense touches, through the coverglass 700.

The enlargement illustrates additional aspects of this example relating to the flex circuit 102. In some implementations, the extra length of the flex circuit 102 can facilitate placement of a camera 702 against an inside surface of the coverglass 700. A Cartesian coordinate system indicates x-, y- and z-directions corresponding to those in FIG. 3.

The flex circuit 102 here includes main portions 704 and 706. The main portions 704 and 706 can extend essentially in a longitudinal direction of the bracket 120. The flex circuit 102 can then be routed by the camera 702 so as to bypass it. The following portions of the flex circuit 102 can then be identified. A portion 708 of the flex circuit 102 can extend from the main portion 704 in a direction that is diverging from the longitudinal direction of the bracket 120. Particularly, the direction can allow the portion 708 to reach the back of the cap 108 (e.g., where the plate 504 in FIG. 5 can be situated). A portion 710 of the flex circuit 102 can extend from the portion 708 past the camera 702. For example, the portion 710 can span the length of the plate 504 in FIG. 5. A portion 712 of the flex circuit 102 can extend from the portion 710 in a direction toward the main portion 706 where the portion 712 and the main portion 706 meet. Having the portions 708, 710 and 712 can allow the flex circuit 102 to span a longer distance than if the flex circuit 102 had the main portion 704 linearly joined to the main portion 706 by a segment in the longitudinal direction of the bracket 120. Accordingly, the extra length of the flex circuit 102 represented by the portions 708-712 can facilitate routing of the flex circuit 102 about the camera 702 or another component.

The extra length of the flex circuit 102 represented by the portions 708-712 can assume any shape depending on the geometry of nearby components. Here, the portions 708-712 are symmetrical about the camera 702. The portions 708 and 712 can have essentially the same length and opposite slopes as each other, and may be equidistantly placed with regard to the camera 702. The routing of the flex circuit, which is accommodated by the portions 708-712, is here symmetrical about the camera 702.

Figure 8:
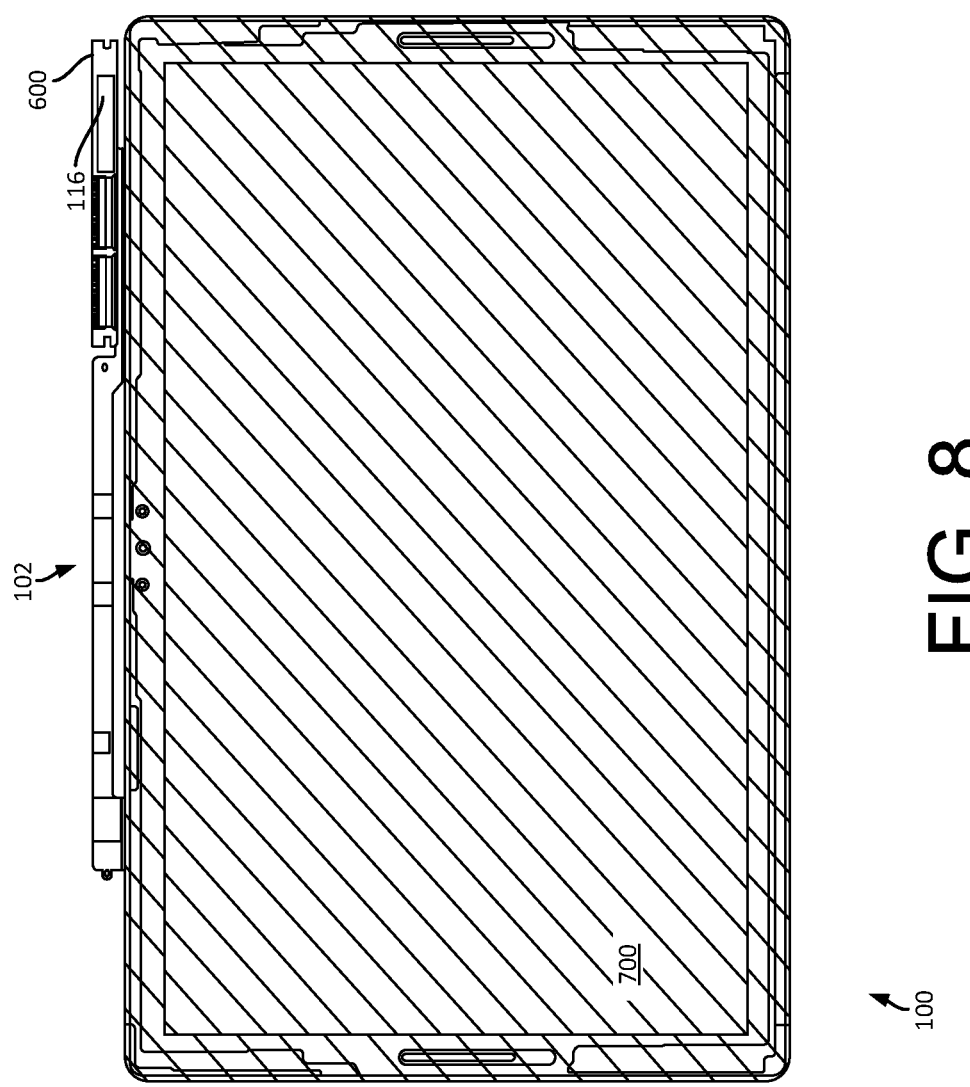
FIG. 8 shows a front view of the device in FIG. 1 prior to some assembly.

FIG. 8 shows a front view of the device 100 in FIG. 1 prior to some assembly. The device 100 as exemplified here can be used with one or more other examples described herein. The flex circuit 102 has not been folded but rather currently has a more flat configuration that may correspond to a stage in the assembly process. The circuit board 600 is provided with the TRC 116. The device can here be considered as being viewed from the front, and the coverglass 700 is currently visible.

Figure 9A:
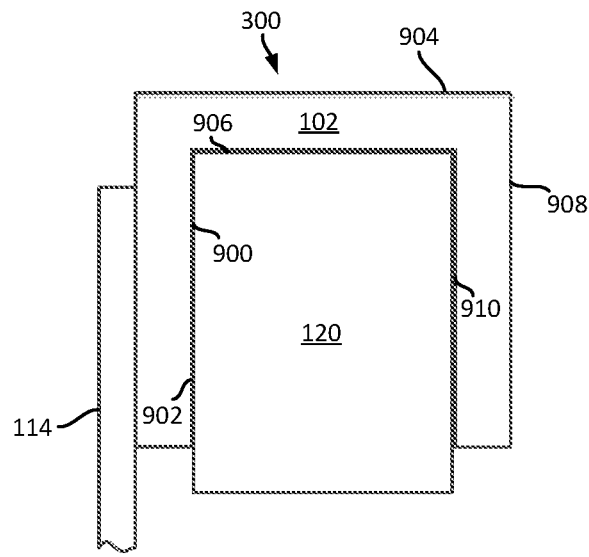
FIGS. 9A-B show cross sections of the flex circuit in FIG. 1.
Figure 9B:
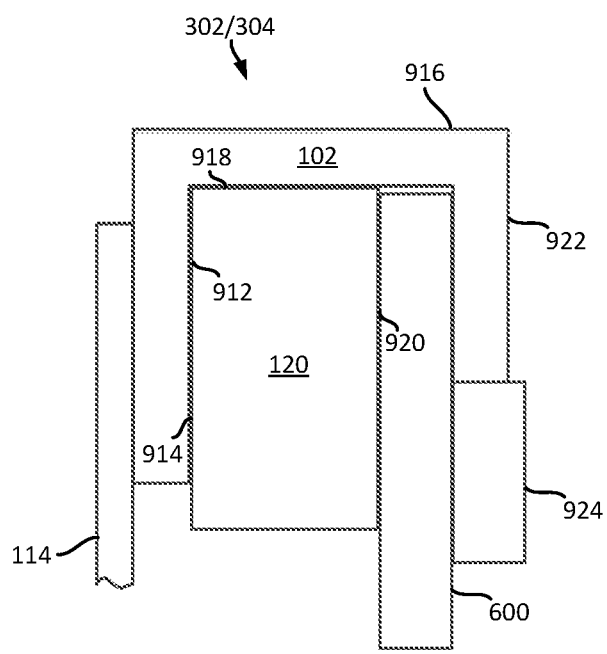

FIGS. 9A-B show cross sections of the flex circuit 102 in FIG. 1. The flex circuit 102 as exemplified here can be used with one or more other examples described herein. FIG. 9A shows an example that relates to the junction 118A (FIG. 1), where it is the flex member 300 of the flex circuit 102 that is being coupled to the mesh 114 (e.g., to traces thereof) and being at least partially wrapped about the bracket 120. Wrapping the flex member 300 about the bracket 120 can include bending or folding or otherwise deforming the flex member 300 so that the flex member 300 simultaneously is in contact with at least two surfaces of the bracket 120. The flex member 300 can be affixed to one or more surfaces of the bracket 120 using an adhesive (e.g., PSA).

The flex member 300 can here include a portion 900 that is coupled to the mesh 114 (e.g., by ACF). The portion 900 can at least in part be positioned between the mesh 114 and a surface 902 of the bracket 120. The flex member 300 can here include a portion 904 that is positioned against a surface 906 of the bracket 120. The flex member 300 can here include a portion 908 that is positioned against a surface 910 of the bracket 120 which is opposite the surface 902. The portion 908 can extend a significant distance away from the junction 118A (e.g., toward the TRC 116 in FIG. 1). For example, the flex member 300 can be wrapped about the bracket 120 so as to touch at least surfaces 902 and 906 of the bracket 120. For example, the flex member 300 can be wrapped about the bracket 120 so as to touch at least surfaces 902 and 910 of the bracket 120. For example, the flex member 300 can be wrapped about the bracket 120 so as to touch at least surfaces 906 and 910 of the bracket 120.

FIG. 9B shows an example that relates to the junctions 118B-C (FIG. 1), where the flex members 302 and/or 304 of the flex circuit 102 can be coupled to the mesh 114 (e.g., to traces thereof) and be at least partially wrapped about the bracket 120. Wrapping the flex member 302/304 about the bracket 120 can include bending or folding or otherwise deforming the flex member 302/304 so that the flex member 302/304 simultaneously is in contact with at least two surfaces of the bracket 120. The flex member 302 and/or 304 can be affixed to one or more surfaces of the bracket 120 using an adhesive (e.g., PSA).

The flex member 302 and/or 304 can here include a portion 912 that is coupled to the mesh 114 (e.g., by ACF). The portion 912 can at least in part be positioned between the mesh 114 and a surface 914 of the bracket 120. The flex member 302 and/or 304 can here include a portion 916 that is positioned against a surface 918 of the bracket 120. The circuit board 600 (FIG. 6) can be positioned against a surface 920 of the bracket 120 that is opposite the surface 914. The flex member 302 and/or 304 can here include a portion 922 that is wrapped against the surface 920 by way of the circuit board 600. For example, the surface 920 provides a plane area against which the flex member 302 and/or 304 can position the circuit board 600. The portion 922 can be coupled to a terminal 924 of the circuit board 600 (e.g., for the TRC 116 in FIG. 1). For example, the flex member 302/304 can be wrapped about the bracket 120 so as to touch at least surfaces 914 and 918 of the bracket 120. For example, the flex member 302/304 can be wrapped about the bracket 120 so as to touch at least surfaces 914 and 920 of the bracket 120. For example, the flex member 302/304 can be wrapped about the bracket 120 so as to touch at least surfaces 918 and 920 of the bracket 120. Here, the flex member does not touch the surface 920 of the bracket 120 but does touch the circuit board 600 that is positioned on the surface 920.

Figure 10A:
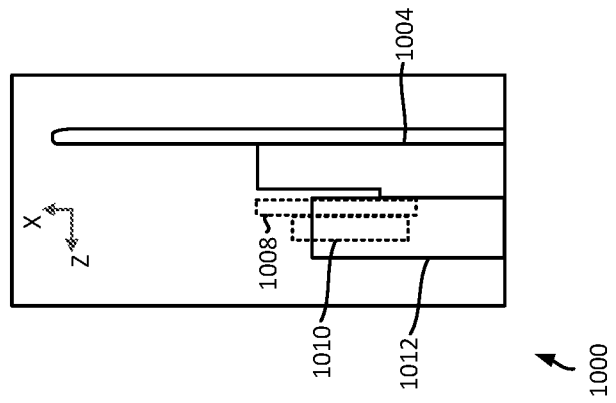
FIGS. 10A-C show cross sections of an example of a device.
Figure 10B:
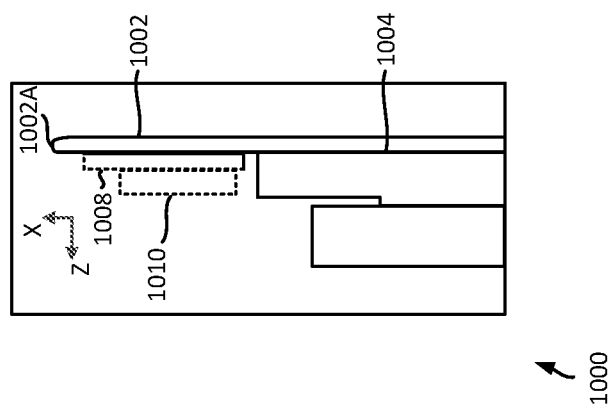
Figure 10C:
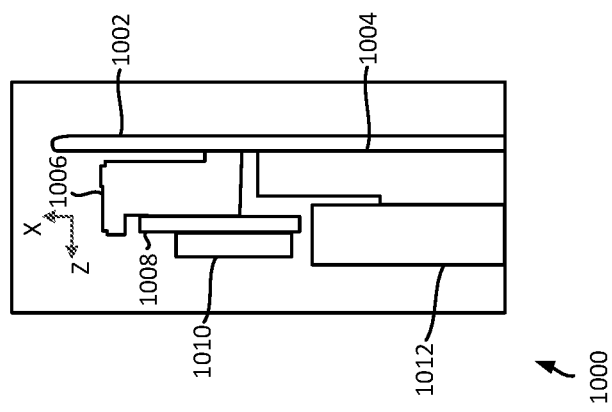

FIGS. 10A-C show cross sections of an example of a device 1000. The device 1000 can be used with one or more other examples described herein. Here, only part of the device 1000 is shown for simplicity. The device 1000 includes a coverglass 1002, a display component 1004 adjacent the inner surface of the coverglass 1002, a bracket 1006 adjacent the inner surface of the coverglass 1002, a circuit board 1008 mounted to the bracket 1006, a TRC 1010 mounted to the circuit board 1008, and a battery component 1012 adjacent the display component 1004. The outer surface of the coverglass 1002 opposite the inner surface can be facing a user during operation, for example to facilitate touchscreen functionality. A coordinate system having respective x- and z-axes visible is shown for illustration. The mentioned components of the device 1000 can serve purposes similar or identical to those of corresponding components described in other examples herein.

FIG. 10A shows that the circuit board 1008 and the TRC 1010 have a different position along the z-axis than, say, the display component 1004. This will be referred to as these components having a different z-value than the display component 1004. The circuit board 1008 and the TRC 1010 also partially overlap the display component 1004 in the x-direction. Such configurations can provide advantages compared to other approaches, for example as will now be described.

Suppose that the bracket 1006 were not used and the circuit board 1008 were positioned adjacent the coverglass 1002. FIG. 10B shows an example of such a configuration. The circuit board 1008 then extends further toward an edge 1002A of the coverglass 1002 than in FIG. 10A. As such, the circuit board 1008 and the TRC 1010 occupy more space in the x-direction in this example than in the previous one. This can lead to disadvantages, including, but not limited to, a wider border around the display component 1004.

Suppose, instead, that the circuit board 1008 were mounted to the display component 1004, again without using the bracket 1006. FIG. 10C shows an example of such a configuration. The circuit board 1008 and the TRC 1010 do not occupy more space in the x-direction compared to the example in FIG. 10A. However, the circuit board 1008 and the TRC 1010 now encroach on the space that is available for the battery component 1012. This can lead to disadvantages, including, but not limited to, that the battery component 1012 is made smaller than in, say, FIG. 10A.

That is, a configuration of the device 1000 with the bracket 1006 can allow the circuit board 1008 and the TRC 1010 to be positioned in the x-direction and/or the z-direction in a way that accommodates other components and uses the available space efficiently. For example, the circuit board 1008 and/or the TRC 1010 can partially overlap the display component 1004 in the x-direction and/or can have substantially the same z-value as the battery component 1012.

Figure 11:
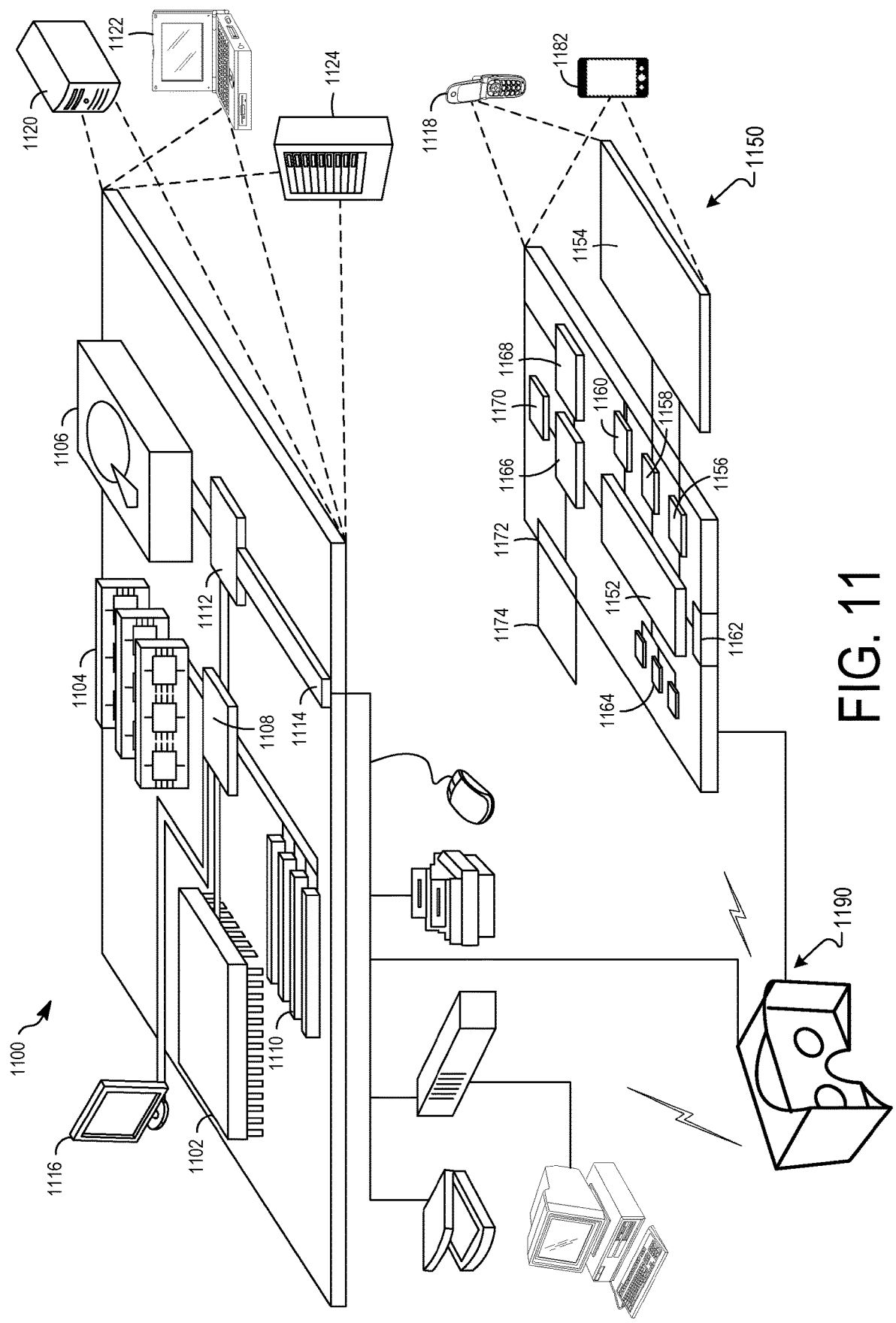
FIG. 11 shows an example of a computer device and a mobile computer device consistent with disclosed embodiments.

FIG. 11 shows an example of a computer device and a mobile computer device that can be used to implement the techniques described here. FIG. 11 shows an example of a generic computer device 1100 and a generic mobile computer device 1150, which may be used with the techniques described here. Computing device 1100 is intended to represent various forms of digital computers, such as laptops, desktops, tablets, workstations, personal digital assistants, televisions, servers, blade servers, mainframes, and other appropriate computing devices. Computing device 1150 is intended to represent various forms of mobile devices, such as personal digital assistants, cellular telephones, smart phones, and other similar computing devices. The components shown here, their connections and relationships, and their functions, are meant to be exemplary only, and are not meant to limit implementations of the inventions described and/or claimed in this document.

Computing device 1100 includes a processor 1102, memory 1104, a storage device 1106, a high-speed interface 1108 connecting to memory 1104 and high-speed expansion ports 1110, and a low speed interface 1112 connecting to low speed bus 1114 and storage device 1106. The processor 1102 can be a semiconductor-based processor. The memory 1104 can be a semiconductor-based memory. Each of the components 1102, 1104, 1106, 1108, 1110, and 1112, are interconnected using various busses, and may be mounted on a common motherboard or in other manners as appropriate. The processor 1102 can process instructions for execution within the computing device 1100, including instructions stored in the memory 1104 or on the storage device 1106 to display graphical information for a GUI on an external input/output device, such as display 1116 coupled to high speed interface 1108. In other implementations, multiple processors and/or multiple buses may be used, as appropriate, along with multiple memories and types of memory. Also, multiple computing devices 1100 may be connected, with each device providing portions of the necessary operations (e.g., as a server bank, a group of blade servers, or a multi-processor system).

The memory 1104 stores information within the computing device 1100. In one implementation, the memory 1104 is a volatile memory unit or units. In another implementation, the memory 1104 is a non-volatile memory unit or units. The memory 1104 may also be another form of computer-readable medium, such as a magnetic or optical disk.

The storage device 1106 is capable of providing mass storage for the computing device 1100. In one implementation, the storage device 1106 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 1104, the storage device 1106, or memory on processor 1102.

The high speed controller 1108 manages bandwidth-intensive operations for the computing device 1100, while the low speed controller 1112 manages lower bandwidth-intensive operations. Such allocation of functions is exemplary only. In one implementation, the high-speed controller 1108 is coupled to memory 1104, display 1116 (e.g., through a graphics processor or accelerator), and to high-speed expansion ports 1110, which may accept various expansion cards (not shown). In the implementation, low-speed controller 1112 is coupled to storage device 1106 and low-speed expansion port 1114. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 1100 may be implemented in a number of different forms, as shown in the figure. For example, it may be implemented as a standard server 1120, or multiple times in a group of such servers. It may also be implemented as part of a rack server system 1124. In addition, it may be implemented in a personal computer such as a laptop computer 1122. Alternatively, components from computing device 1100 may be combined with other components in a mobile device (not shown), such as device 1150. Each of such devices may contain one or more of computing device 1100, 1150, and an entire system may be made up of multiple computing devices 1100, 1150 communicating with each other.

Computing device 1150 includes a processor 1152, memory 1164, an input/output device such as a display 1154, a communication interface 1166, and a transceiver 1168, among other components. The device 1150 may also be provided with a storage device, such as a microdrive or other device, to provide additional storage. Each of the components 1150, 1152, 1164, 1154, 1166, and 1168, are interconnected using various buses, and several of the components may be mounted on a common motherboard or in other manners as appropriate.

The processor 1152 can execute instructions within the computing device 1150, including instructions stored in the memory 1164. The processor may be implemented as a chipset of chips that include separate and multiple analog and digital processors. The processor may provide, for example, for coordination of the other components of the device 1150, such as control of user interfaces, applications run by device 1150, and wireless communication by device 1150.

Processor 1152 may communicate with a user through control interface 1158 and display interface 1156 coupled to a display 1154. The display 1154 may be, for example, a TFT LCD (Thin-Film-Transistor Liquid Crystal Display) or an OLED (Organic Light Emitting Diode) display, or other appropriate display technology. The display interface 1156 may comprise appropriate circuitry for driving the display 1154 to present graphical and other information to a user. The control interface 1158 may receive commands from a user and convert them for submission to the processor 1152. In addition, an external interface 1162 may be provide in communication with processor 1152, so as to enable near area communication of device 1150 with other devices. External interface 1162 may provide, for example, for wired communication in some implementations, or for wireless communication in other implementations, and multiple interfaces may also be used.

The memory 1164 stores information within the computing device 1150. The memory 1164 can be implemented as one or more of a computer-readable medium or media, a volatile memory unit or units, or a non-volatile memory unit or units. Expansion memory 1174 may also be provided and connected to device 1150 through expansion interface 1172, which may include, for example, a SIMM (Single In Line Memory Module) card interface. Such expansion memory 1174 may provide extra storage space for device 1150, or may also store applications or other information for device 1150. Specifically, expansion memory 1174 may include instructions to carry out or supplement the processes described above, and may include secure information also. Thus, for example, expansion memory 1174 may be provide as a security module for device 1150, and may be programmed with instructions that permit secure use of device 1150. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 1164, expansion memory 1174, or memory on processor 1152, that may be received, for example, over transceiver 1168 or external interface 1162.

Device 1150 may communicate wirelessly through communication interface 1166, which may include digital signal processing circuitry where necessary. Communication interface 1166 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 1168. In addition, short-range communication may occur, such as using a Bluetooth, WiFi, or other such transceiver (not shown). In addition, GPS (Global Positioning System) receiver module 1170 may provide additional navigation- and location-related wireless data to device 1150, which may be used as appropriate by applications running on device 1150.

Device 1150 may also communicate audibly using audio codec 1160, which may receive spoken information from a user and convert it to usable digital information. Audio codec 1160 may likewise generate audible sound for a user, such as through a speaker, e.g., in a handset of device 1150. Such sound may include sound from voice telephone calls, may include recorded sound (e.g., voice messages, music files, etc.) and may also include sound generated by applications operating on device 1150.

The computing device 1150 may be implemented in a number of different forms, as shown in the figure. For example, it may be implemented as a cellular telephone 1180. It may also be implemented as part of a smart phone 1182, personal digital assistant, or other similar mobile device.

A user can interact with a computing device using a tracked controller 1184. In some implementations, the controller 1184 can track the movement of a user's body, such as of the hand, foot, head and/or torso, and generate input corresponding to the tracked motion. The input can correspond to the movement in one or more dimensions of motion, such as in three dimensions. For example, the tracked controller can be a physical controller for a VR application, the physical controller associated with one or more virtual controllers in the VR application. As another example, the controller 1184 can include a data glove.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

In some implementations, the computing devices depicted in FIG. 11 can include sensors that interface with a virtual reality (VR headset 1185). For example, one or more sensors included on a computing device 1150 or other computing device depicted in FIG. 11, can provide input to VR headset 1185 or in general, provide input to a VR space. The sensors can include, but are not limited to, a touchscreen, accelerometers, gyroscopes, pressure sensors, biometric sensors, temperature sensors, humidity sensors, and ambient light sensors. The computing device 1150 can use the sensors to determine an absolute position and/or a detected rotation of the computing device in the VR space that can then be used as input to the VR space. For example, the computing device 1150 may be incorporated into the VR space as a virtual object, such as a controller, a laser pointer, a keyboard, a weapon, etc. Positioning of the computing device/virtual object by the user when incorporated into the VR space can allow the user to position the computing device to view the virtual object in certain manners in the VR space. For example, if the virtual object represents a laser pointer, the user can manipulate the computing device as if it were an actual laser pointer. The user can move the computing device left and right, up and down, in a circle, etc., and use the device in a similar fashion to using a laser pointer.

In some implementations, one or more input devices included on, or connect to, the computing device 1150 can be used as input to the VR space. The input devices can include, but are not limited to, a touchscreen, a keyboard, one or more buttons, a trackpad, a touchpad, a pointing device, a mouse, a trackball, a joystick, a camera, a microphone, earphones or buds with input functionality, a gaming controller, or other connectable input device. A user interacting with an input device included on the computing device 1150 when the computing device is incorporated into the VR space can cause a particular action to occur in the VR space.

In some implementations, a touchscreen of the computing device 1150 can be rendered as a touchpad in VR space. A user can interact with the touchscreen of the computing device 1150. The interactions are rendered, in VR headset 1185 for example, as movements on the rendered touchpad in the VR space. The rendered movements can control objects in the VR space.

In some implementations, one or more output devices included on the computing device 1150 can provide output and/or feedback to a user of the VR headset 1185 in the VR space. The output and feedback can be visual, tactical, or audio. The output and/or feedback can include, but is not limited to, vibrations, turning on and off or blinking and/or flashing of one or more lights or strobes, sounding an alarm, playing a chime, playing a song, and playing of an audio file. The output devices can include, but are not limited to, vibration motors, vibration coils, piezoelectric devices, electrostatic devices, light emitting diodes (LEDs), strobes, and speakers.

In some implementations, the computing device 1150 may appear as another object in a computer-generated, 3D environment. Interactions by the user with the computing device 1150 (e.g., rotating, shaking, touching a touchscreen, swiping a finger across a touch screen) can be interpreted as interactions with the object in the VR space. In the example of the laser pointer in a VR space, the computing device 1150 appears as a virtual laser pointer in the computer-generated, 3D environment. As the user manipulates the computing device 1150, the user in the VR space sees movement of the laser pointer. The user receives feedback from interactions with the computing device 1150 in the VR space on the computing device 1150 or on the VR headset 1185.

A number of embodiments have been described. Nevertheless, it will be understood that various modifications may be made without departing from the spirit and scope of the invention.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

What is claimed is:

1. A device comprising:
   a sensor component; and
   a touch panel comprising:
   touch-registration circuitry;
   a mesh comprising conductors, wherein at least some of the conductors are routed to a junction; and
   a flex circuit coupled between the junction and the touch-registration circuitry, wherein the flex circuit is longer, between the junction and the touch registration circuitry, than a distance between the junction and the touch-registration circuitry to accommodate routing of the flex circuit past the sensor component.

2. The device of claim 1, wherein the conductors comprise first conductors oriented in a first direction in the mesh, and second conductors oriented in a second direction in the mesh, the first conductors double-routed from the mesh to the junction.

3. The device of claim 2, wherein the device has at least first, second and third junctions and wherein the flex circuit comprises first and second flex members, wherein the first flex member is coupled between the first junction and the touch-registration circuitry and is longer than the distance between the junction and the touch-registration circuitry, wherein the first conductors are double-routed from the mesh to the first and second junctions, wherein the second flex member is coupled between the second junction and the touch-registration circuitry, and wherein the second conductors are routed from the mesh to the third junction.

4. The device of claim 3, wherein the second conductors form a stepwise width increase along an edge of the mesh in being routed from the mesh to the third junction, and wherein the first flex member bypasses the stepwise width increase.

5. The device of claim 4, further comprising an aperture for the sensor component, the stepwise width increase located between the aperture and the edge of the mesh.

6. The device of claim 3, wherein the second flex member is also coupled between the third junction and the touch-registration circuitry.

7. The device of claim 1, further comprising a bracket positioned along an edge of the mesh, the bracket configured for holding the sensor component.

8. The device of claim 7, further comprising a cap that positions the sensor component against the bracket.

9. The device of claim 7, further comprising a conductive surface on the bracket that provides ground for the touch-registration circuitry and for a display panel of the device.

10. The device of claim 7, wherein at least part of the flex circuit is wrapped against two opposite sides of the bracket.

11. The device of claim 10, wherein the flex circuit includes an alignment hole, and wherein the bracket includes a pin corresponding to the alignment hole.

12. The device of claim 10, further comprising an alignment rail on the bracket, the alignment rail aligning the flex circuit against the bracket.

13. The device of claim 10, further comprising adhesive coupling at least a first portion of the flex circuit to the bracket, the coupling causing a second portion of the flex circuit to conform to the sensor component.

14. The device of claim 10, wherein the flex circuit comprises first and second flex members, wherein at least part of each of the first and second flex members is wrapped against the two opposite sides of the bracket.

15. A tablet comprising:
    a coverglass;
    a sensor component positioned against the coverglass;
    a display panel configured to be viewed through the coverglass; and
    a touch panel comprising:
    touch-registration circuitry;
    a mesh positioned between the coverglass and the display panel, the mesh comprising conductors, wherein at least some of the conductors are routed to a junction; and
    a flex circuit coupled between the junction and the touch-registration circuitry, wherein the flex circuit is longer, between the junction and the touch registration circuitry, than a distance between the junction and the touch-registration circuitry to accommodate routing of the flex circuit past the sensor component.

16. The tablet of claim 15, wherein the conductors comprise first conductors oriented in a first direction in the mesh, and second conductors oriented in a second direction in the mesh, the first conductors double-routed from the mesh to the junction, and wherein the first direction corresponds to a horizontal direction in a landscape orientation of the tablet, and wherein the second direction corresponds to a vertical direction in the landscape orientation of the tablet.

17. The tablet of claim 15, wherein the routing of the flex circuit is symmetrical about the sensor component.

18. A device comprising:
    a sensor component;
    a bracket configured to hold the sensor component; and
    a touch panel, wherein the bracket is mounted to the touch panel, the touch panel comprising:
    touch-registration circuitry;
    a mesh comprising conductors, wherein at least some of the conductors are routed to a junction; and
    a flex circuit coupled between the junction and the touch-registration circuitry, wherein at least part of the flex circuit is wrapped against two opposite sides of the bracket.

19. The device of claim 18, further comprising a coverglass and a display panel configured to be viewed through the coverglass, wherein the mesh is positioned between the coverglass and the display panel.

20. The device of claim 19, wherein the flex circuit accommodates placement of the sensor component against an inside surface of the coverglass.

21. The device of claim 19, wherein the touch-registration circuitry is mounted to the bracket and wherein the bracket positions the touch-registration circuitry so that the touch-registration circuitry partially overlaps the display panel.

22. The device of claim 18, wherein the flex circuit comprises first and second main portions extending in a first direction, and wherein: a first portion of the flex circuit extends from the first main portion in a second direction diverging from the first direction, a second portion of the flex circuit extends from the first portion past the sensor component in the first direction, and a third portion of the flex circuit extends from the second portion in a third direction toward the second main portion.

23. The device of claim 18, wherein the sensor component comprises a camera.

* * * * *

UNITED STATES PATENT AND TRADEMARK OFFICE
CERTIFICATE OF CORRECTION

PATENT NO.        : 10,824,203 B2
APPLICATION NO.   : 16/104763
DATED             : November 3, 2020
INVENTOR(S)       : Wong et al.

Page 1 of 1

It is certified that error appears in the above-identified patent and that said Letters Patent is hereby corrected as shown below:

On the Title Page

Item (72), in "Inventors", Line 4, delete "Jannick," and insert -- Janninck, --, therefor.

Signed and Sealed this
Twenty-third Day of February, 2021

Drew Hirshfeld
*Performing the Functions and Duties of the
Under Secretary of Commerce for Intellectual Property and
Director of the United States Patent and Trademark Office*